United States Patent
Singhal

(10) Patent No.: US 9,287,858 B1
(45) Date of Patent: Mar. 15, 2016

(54) LOW LEAKAGE SHADOW LATCH-BASED MULTI-THRESHOLD CMOS SEQUENTIAL CIRCUIT

(71) Applicant: Texas Instruments Incorporated, Dallas, TX (US)

(72) Inventor: Vipul Kumar Singhal, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/521,853

(22) Filed: Oct. 23, 2014

(51) Int. Cl.
*H03K 3/289* (2006.01)
*H03K 3/3562* (2006.01)
*H03K 3/012* (2006.01)

(52) U.S. Cl.
CPC ............ *H03K 3/35625* (2013.01); *H03K 3/012* (2013.01)

(58) Field of Classification Search
None
See application file for complete search history.

(56) References Cited

U.S. PATENT DOCUMENTS

| | | | |
|---|---|---|---|
| 7,215,155 | B2 | 5/2007 | Won |
| 7,332,949 | B2 | 2/2008 | Kim |
| 7,391,249 | B2 | 6/2008 | Lee et al. |
| 7,453,300 | B2 | 11/2008 | Won et al. |
| 7,613,942 | B2 | 11/2009 | Fallah et al. |
| 2009/0066386 | A1* | 3/2009 | Lee .................... H03K 3/35625 327/202 |
| 2009/0114994 | A1 | 5/2009 | Kim |
| 2011/0248759 | A1* | 10/2011 | Chi ................... H03K 3/356008 327/202 |

FOREIGN PATENT DOCUMENTS

EP 1510006 B1 10/2008

OTHER PUBLICATIONS

Shigematsu, A 1-V High-Speed MTCMOS Circuit Scheme for Power-Down Application Circuits, IEEE Journal of Solid-State Circuits, vol. 32, No. 6, Jun. 1997, pp. 861-869.
Mutoh et al., 1-V Power Supply High-Speed Digital Circuit Technology with Multithreshold-Voltage CMOS, IEEE Journal of Solid-State Circuits, vol. 30, No. 8, Aug. 1995, pp. 847-854.
Shigematsu et al., 40Gb/s CMOS Distributed Amplifier for Fiber-Optic Communication Systems, ISSCC 2004, Session 26, Optical and Fast I/O, 26.4, Jun. 2004, 10 pgs.
Won et al., An MTCMOS Design Methodology and Its Application to Mobile Computing, ISLPED '03, Aug. 25-27, 2003, Seoul, Korea, pp. 110-115.
Priyank et al., Design and Simulation of MTCMOS Circuits, IJR-RECS, Oct. 2013, vol. 1, Issue-6, ISSN 2321-5461, pp. 1563-1568.

* cited by examiner

*Primary Examiner* — Long Nguyen
(74) *Attorney, Agent, or Firm* — John R. Pessetto; Frank D. Cimino

(57) ABSTRACT

Multi-threshold CMOS (MTCMOS) sequential circuits are presented with a first latch circuit formed of transistors with threshold voltages in a first range, along with a second latch circuit with inverters and a transfer gate formed of higher threshold voltage transistors for low-power retention of data from the first latch with power switching circuitry to selectively decouple inverters of the second latch circuit from a voltage supply during low-power retention mode operation of the sequential circuit.

20 Claims, 10 Drawing Sheets

| | ACTIVE | PD1 | PD2 | PD3 | PD4 | LPR | PU1 | PU2 | PU3 | PU4 | ACTIVE |
|---|---|---|---|---|---|---|---|---|---|---|---|
| RET | 0 | 0 | 1 | 1 | 1 | 1 | 1 | 1 | 1 | 0 | 0 |
| TSFRZ | 1 | 0 | 0 | 0 | 1 | 1 | 1 | 0 | 0 | 0 | 1 |
| PONINZ | 0 | 0 | 0 | 1 | 1 | 1 | 1 | 1 | 0 | 0 | 0 |

LOW LEAKAGE SHADOW LATCH-BASED MULTI-THRESHOLD CMOS SEQUENTIAL CIRCUIT

REFERENCE TO RELATED APPLICATION

This application claims priority to, and the benefit of, Indian provisional application number 4285/CHE/2014, entitled "LOW LEAKAGE SHADOW LATCH-BASED MULTI-THRESHOLD CMOS SEQUENTIAL CIRCUIT", and filed in India on Sep. 3, 2014, the entirety of which is hereby incorporated by reference.

BACKGROUND

Multi-threshold CMOS (MTCMOS) circuits facilitate low-power operation of many modern devices, particularly portable battery powered electronic products. Low-power operation is sometimes also referred to as standby or sleep-mode operation in which certain non-critical circuitry is disconnected from power and/or ground connections, with supervisory circuitry remaining powered for data retention and for reestablishment of active mode operation upon detection of certain operating conditions and/or after a predetermined period of time. For example, mobile phones not currently supporting a call session may enter the low-power operating mode and periodically "wake up" for communications with a base station, and if no call is directed to the phone, the device may resume low-power operation in order to conserve battery power. In addition, many applications require retention of data during low-power or standby operation. High speed operation and active mode efficiency are facilitated by use of low voltage CMOS circuitry with low threshold voltage (low-Vt) transistors. Accordingly, many digital circuits are designed around a standard transistor threshold voltage (SVT) which is relatively low in order to enhance efficiency during active mode operation, and some circuits may include even lower threshold voltage devices (LVT). However, the low threshold voltage of such devices may lead to unacceptably high levels of leakage current during standby operation. Multi-threshold CMOS circuits employ power disconnection transistors with higher threshold voltages (HVT) to disconnect power and/or ground connections from the lower threshold voltage devices, and to construct balloon or shadow latch circuits for retaining data during power down of the remaining circuitry. However, conventional HVT-based retention flip-flops and other sequential circuits suffer from poor performance and lack of robustness, particularly at low operating voltage levels. Conversely, LVT or SVT sequential circuits suffer from high leakage in the low-power retention mode. Accordingly, a need remains for improved MTCMOS sequential circuits providing the capability for low-power retention mode with low leakage currents, while providing high-speed active mode operation for ultra-low-power and other applications in which power efficiency is important.

SUMMARY

Presently disclosed embodiments provide sequential circuits including a latch circuit built from transistors with threshold voltages in a first range for high-speed active mode operation, along with a second latch formed of transistors with threshold voltages in a second, higher range, for retaining data during low-power retention mode operation. The second latch includes inverters and transfer gates, as well as power switching circuitry to decouple the inverters from power connections during active mode operation, such that all operating transistors during active mode operation are implemented in SVT or LVT transistors with threshold voltages in the first range, where the second latch is disconnected from the first latch during both active mode and low-power retention mode to mitigate leakage current, with a transfer gate connecting the first and second latches being turned on during transitions from active to low-power retention mode and vice versa. Moreover, the primary data path in the first latch (and any additional latch in a master-slave latch configuration for flip-flop applications) does not include any HVT transistors, whereby performance parameters such as set up-time, hold-time, clock-to-output delay and minimum clock pulse widths can be unaffected by the isolated HVT transistors during active mode operation, while leakage in the low-power retention mode is unaffected by the SVT and/or LVT circuitry. The presently disclosed concepts may thus be advantageously employed for flip-flops, integrated clock-gating cells (ICGs) or other sequential circuits for high active mode performance and low leakage in the low-power retention mode.

A multi-threshold CMOS sequential circuit is provided, including first and second latch with a first latch circuit including transfer gates and inverters powered from a switchable voltage node and formed of transistors having threshold voltages in a first range to provide a primary data path storing at least one data bit during active mode operation of the sequential circuit. A first switching circuit selectively decouples the switchable voltage node from a continuous voltage node when a switching control signal is in a first state for low-power retention mode operation of the sequential circuit, and the first switching circuit couples the switchable voltage node to the continuous voltage node when the switching control signal is in a second state for active mode operation of the sequential circuit. The second latch circuit includes inverters formed of transistors selectively powered from the continuous voltage node and having threshold voltages in a second range higher than the first range. In low-power retention mode operation, the inverters of the second latch circuit selectively latch the data bit transferred from the first latch circuit. The second latch circuit further includes a transfer gate formed of transistors having threshold voltages in the second range which provides a data transfer path between the first and second latch circuits during transitions from active to low-power retention mode and vice versa, and the transmission gate disconnects the first and second latch circuits from one another during both active mode and low-power retention mode operation. A second switching circuit selectively disconnects the inverters of the second latch circuit from the continuous voltage node during active mode operation of the sequential circuit.

In certain embodiments, the first latch is a slave latch, and a master latch circuit is provided to form a flip-flop, with the master latch providing a flip-flop input and the slave latch providing a flip-flop data output, and with the second latch providing a shadow latch or balloon latch to save the flip-flop data bit during low-power retention mode operation. In other embodiments, the sequential circuit is a clock gating cell which receives a clock enable signal, along with an AND gate powered from the switchable voltage node, with a first input receiving the clock signal, a second input coupled with latch node of the first latch circuit, and an output providing a clock output signal, where the second latch circuit stores the clock data state in the low-power retention mode.

In certain embodiments, a control circuit selectively operates in a first mode for low-power retention mode operation or in a second mode for active mode operation of the sequential circuit. The control circuit provides separate retention, power switching control, and transfer signals in certain embodiments to implement a power down sequence to transition from the low-power retention mode to the active mode, as well as a power up sequence to transition from active mode operation to low-power retention mode operation, where the transfer gate of the second latch circuit connects the first and second latches only during the transitional power up and power down sequences.

A forward bias circuit is provided in certain embodiments to apply a forward bias voltage to one or more transistors of the sequential circuit according to a bias control signal, with the control circuit selectively providing the bias control signal for application of the forward bias voltage for active mode operation and discontinuing the application of the forward bias voltage for low-power retention mode operation.

DESCRIPTION OF THE VIEWS OF THE DRAWINGS

The following description and drawings set forth certain illustrative implementations of the disclosure in detail, which are indicative of several ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
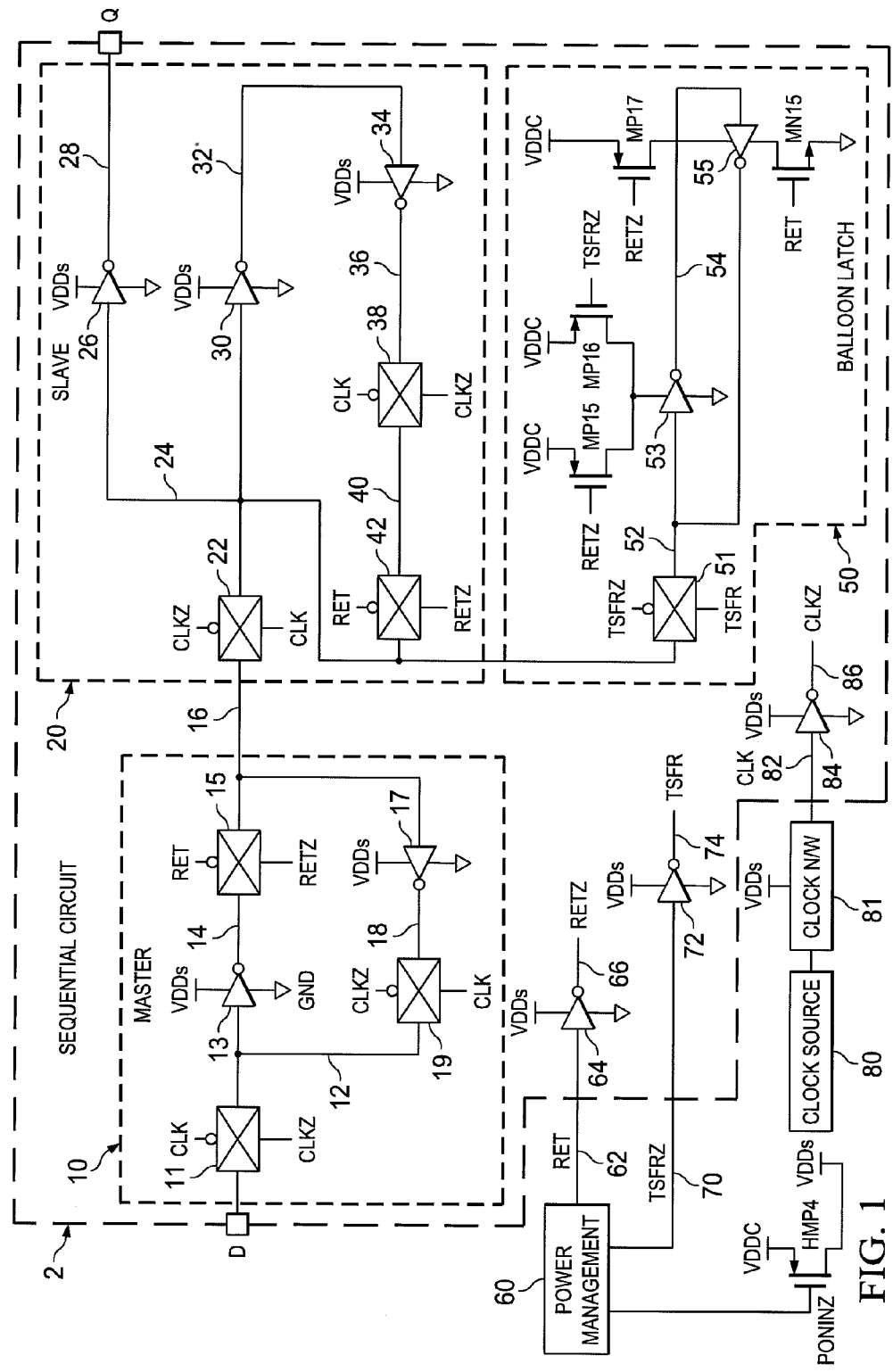
FIG. 1 is a simplified schematic diagram illustrating a flip-flop MTCMOS sequential circuit embodiment with an MTCMOS shadow or balloon latch circuit.

One or more embodiments or implementations are hereinafter described in conjunction with the drawings, wherein like reference numerals are used to refer to like elements throughout, and wherein the various features are not necessarily drawn to scale.

FIG. 1 illustrates an MTCMOS sequential circuit 2 implementing a master-slave latch configuration in an integrated circuit (IC) with a master latch circuit 10 and a slave latch circuit 20 operating as a D flip-flop sequential circuit receiving a data input "D" and providing a data output "Q" under control of a clock signal CLK provided via a clock network 81 from a clock source 80. The master and slave latches 10, 20 are formed of PMOS and NMOS transistors MP and MN, respectively, having threshold voltages in a first range. In certain embodiments, the latches 10 and 20 include transistors formed at a standard or nominal threshold voltage level or range (SVT), although other embodiments are contemplated in which lower threshold voltage (LVT) transistors are used to form the master and/or slave circuits 10, 20, or one or both of the latch circuits 10, 20 may be constructed using a combination of SVT and LVT transistors of different threshold voltage values or ranges, where the collective ranges of such SVT and/or LVT transistors are referred to herein as being within a first threshold voltage range. The sequential circuit 2 further includes a balloon latch or shadow latch 50 with inverters and a transfer gate formed using HVT transistors (indicated generally as HMP and HMN) of a second, higher threshold voltage range. In the illustrated circuitry 2, moreover, all the transistors of the master and slave latches 10 and 20 that are operational in active or normal mode are SVT or LVT transistors having threshold voltages in the first range. This advantageously facilitates high speeds during active mode operation.

As further seen in FIG. 1, a power management control circuit 60 provides various signals including a switching control signal PONINZ provided to the gate of a PMOS high threshold voltage transistor HMP4 forming a first switching circuit to selectively connect or disconnect a switchable voltage node VDDs to or from a continuous voltage node VDDC, such as 1.0 V in one non-limiting example. In this regard, the inverters of the master and slave latches 10 and 20 are selectively (e.g., switchably) powered by the switchable voltage node VDDs, and inverters of the balloon latch circuit 50 are powered from the continuous voltage node VDDC as shown. In certain embodiments, the control circuit or controller 60 provides the switching control signal PONINZ in a first state (high) for low-power retention mode operation with the switchable voltage node VDDs disconnected from VDDC (e.g., master and slave latches 10, 20 powered down), and provides the signal PONINZ in a second (low) state for active mode operation with the master and slave latch circuits 10 and 20 powered. The control circuit 60 further provides a retention signal RET in a first state (high) for low-power retention mode operation and in a second state (low) for active mode operation of the sequential circuit 2. In addition, the control circuit 60 provides a separate transfer signal TSFRZ in a first (hi) state during normal active mode and low-power retention modes and in a second (low) state only during transitions between low-power retention mode and active mode, and is in a second (high) state otherwise as described further below in connection with FIG. 3.

As shown in FIG. 1, the control circuit 60 provides the retention signal RET to an input 62 of an inverter 64 to create an inverted retention signal RETZ at an inverter output 66, and the control circuit 60 provides the transfer signal TSFRZ to an input 70 of an inverter 72 having an output 74 providing an inverted transfer signal TSFR, where the inverters 64 and 72 in certain embodiments are formed using SVT and/or LVT transistors with threshold voltages in the first range and are powered from the switchable voltage node VDDs, although not a strict requirement of all possible embodiments. It is noted, however, that the connection of the inverters 64 and 72 to the switchable voltage node VDDs advantageously saves leakage of two inverter circuits during low-power retention mode, with the outputs RETZ and TSFR from the inverter 64 and 72 will be driven to a low or "0" state at appropriate times by the operation of the power management controller 60 and will remain in the states when the corresponding inverter 64, 72 is powered down by operation of the power control transformer HMP4 when PONINZ is brought low by the controller 60 during low-power retention mode. As further described below in connection with FIGS. 3 and 4, moreover, the controller 60 implements power up and power down sequences in certain embodiments for transitioning between normal and low-power retention modes.

Figure 2:
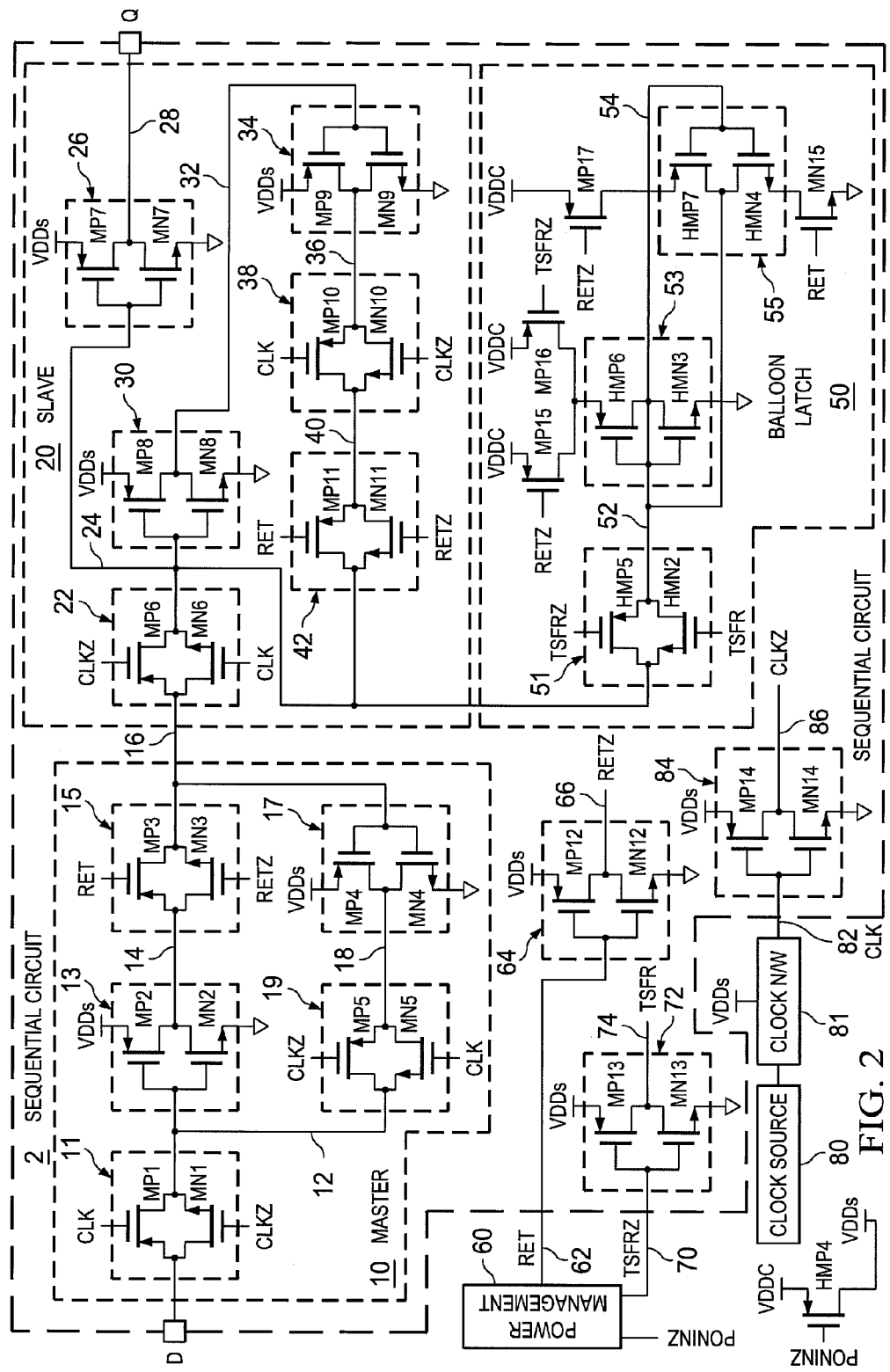
FIG. 2 is a detailed schematic diagram illustrating an implementation of the flip-flop sequential circuit embodiment of FIG. 1.
Figure 7:
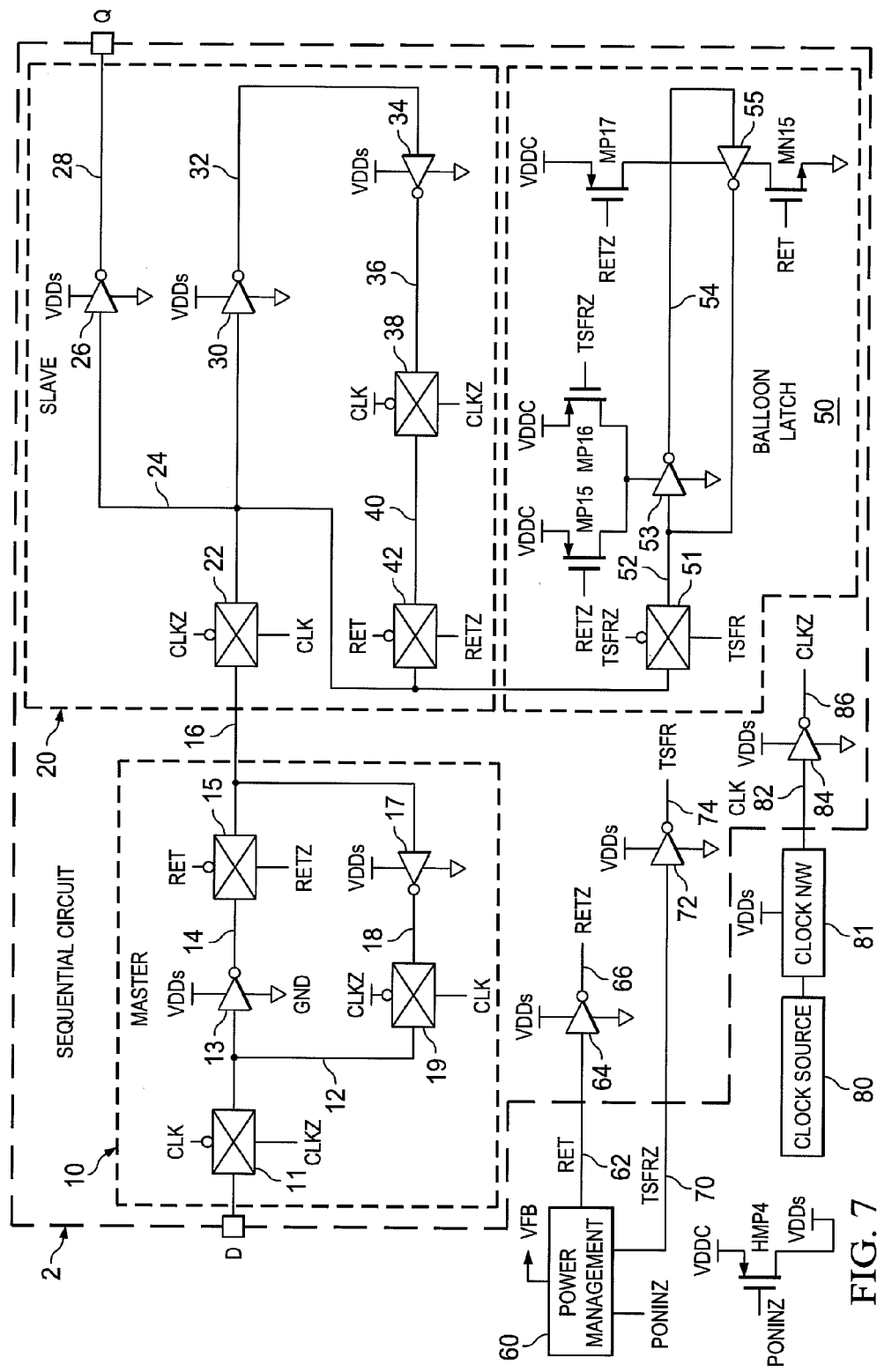
FIG. 7 is a schematic diagram illustrating another flip-flop MTCMOS sequential circuit embodiment including an MTCMOS shadow latch circuit with a controller selectively providing a forward bias control to enhance high speed active mode operation.

The clock distribution network or "clock-tree" 81 in FIGS. 1 and 2 distributes the clock signal throughout the integrated circuit in which the sequential circuit 2 is implemented, where the clock network 81 is powered by the switchable voltage node VDDs in the illustrated embodiment. When powered, the clock network 81 provides a clock signal CLK to an input 82 of an inverter 84 (also formed using SVT/LVT transistors and powered from the VDDs node in this example), with the inverter output 86 providing an inverted clock signal CLKZ. The control circuit 60 can be any suitable logic circuitry, whether programmable or otherwise, configured or otherwise operative when powered to provide control signals RET, TSFRZ, PONINZ and other signals (e.g., VFB as illustrated and described below in connection with FIGS. 7-9) as described herein, where the control circuit 60 in certain embodiments is powered by the continuous voltage node (e.g., VDDC) in order to continuously operate during both active mode, low-power retention mode as well as in power up or power down transition sequences therebetween as described further below.

Referring also to FIG. 2, the latch circuits 10, 20 and 50 each include one or more transfer gates, for example formed as shown in FIG. 2 by parallel connection of a PMOS transistor and an NMOS transistor with the lower NMOS transistor receiving a control signal generated by the control circuit 60 or the clock source 80, and the upper PMOS transistor receiving an inverse of the control signal. The latches 10, 20 and 50 also include inverter circuits which can be formed using any suitable CMOS inverter circuitry, for example as shown in FIG. 2 including an upper PMOS transistor connected between an upper power connection and an output node along with an NMOS transistor connected from the output node to a ground connection, with the transistor gates connected to one another to form an inverter input. In the illustrated sequential circuit 2, the transfer gates and inverters of the master latch circuit 10 and the slave latch circuit 20 are constructed using MOS transistors having threshold voltages in the first range, whereas the transfer gate 51, the inverters 53 and 55, and the power control switching circuit transistors MP15, MP16, MP17 and MN15 of the balloon latch circuit 50 are formed using SVT and/or LVT transistors with threshold voltages in the first range in the illustrated embodiments, although not a strict requirement of all implementations.

Moreover, as shown in FIGS. 1 and 2, the inverter circuits 13, 17, 26, 30 and 34 of the master and slave latch circuits 10, 20 are powered from VDDs, whereas the inverters 53 and 55 of the balloon latch circuit 50 are selectively powered from the continuous voltage node VDDC.

Figure 11:
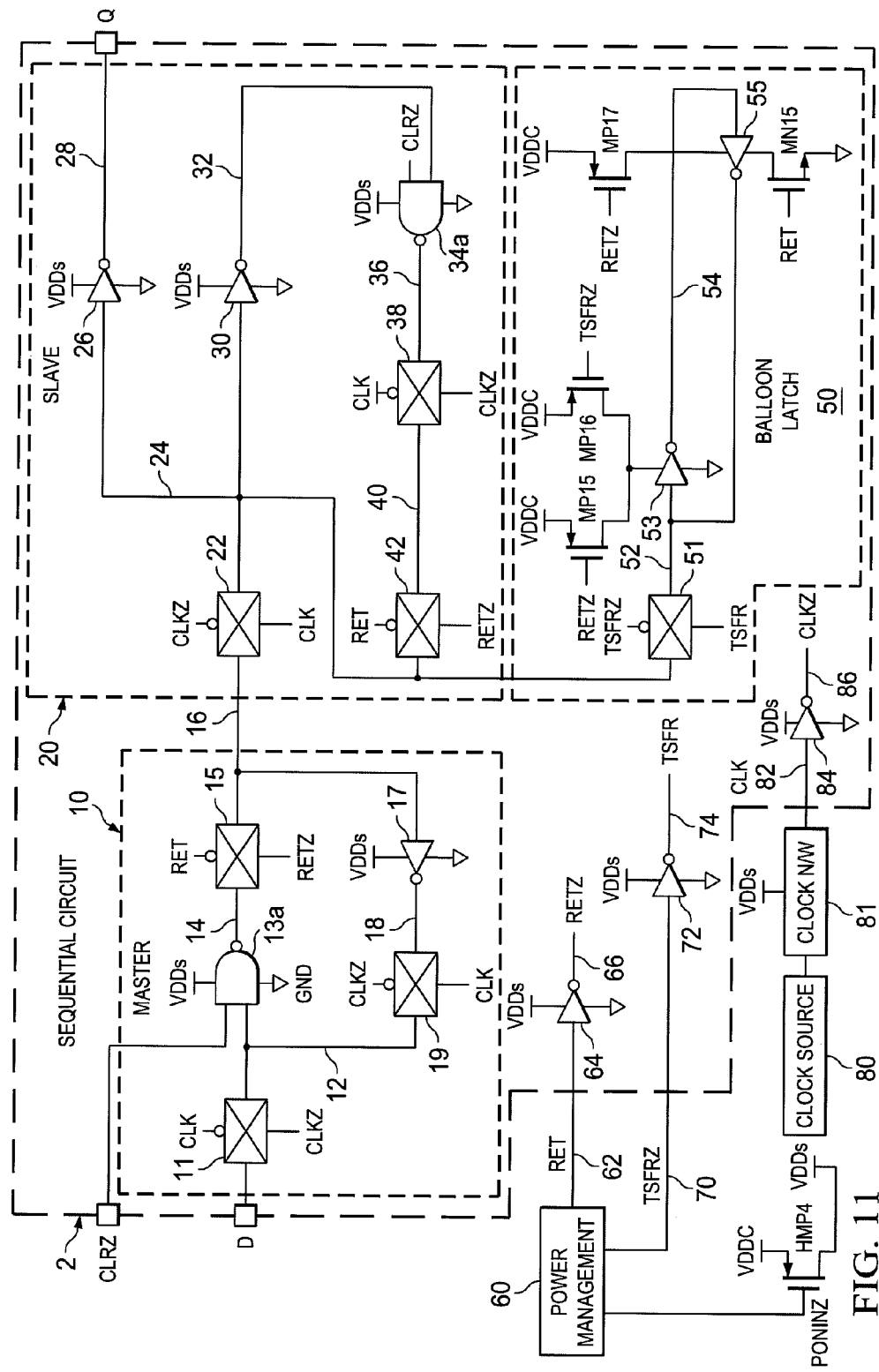
FIG. 11 is a schematic diagram illustrating another flip-flop MTCMOS sequential circuit embodiment in which the master and slave latch circuits include NAND gates for implementing a clear or reset function.

In the illustrated flip-flop sequential circuit embodiment 2, the slave latch 20 includes transfer gates 22, 38 and 42 as well as inverters 26, 30 and 34 connected as shown in order to provide a primary data path storing at least one data bit during active mode operation, with the output inverter 26 providing a "Q" flip-flop data output based on a previously received "D" flip-flop data input received by the master latch circuit 10 in a proceeding clock cycle (e.g., cycle of CLK signal). The first transfer gate 22 operates according to the CLK and CLKZ signals to selectively couple a first latch input node 16 with a first latch node 24 when CLK is high, thereby transferring data from the master latch 10 to the slave latch 20, and the transfer gate 22 decouples the nodes 16 and 24 from one another when the clock signal CLK is low. The first latch node 24 is connected as an input to a first inverter 30 whose output 32 is connected as an input to a second inverter 34. In certain embodiments, the second inverter 34 may be replaced by a logic gate such as a NAND gate 34a, for example, as seen in FIG. 11 below. The output 36 of the second inverter 34 in FIGS. 1 and 2 is selectively connected back to the first latch node 24 to form a latch circuit with the first inverter 30 via transfer gates 38 and 42 operated respectively according to inverted CLK and RET signals from the control circuit 60 as shown. In the illustrated example, the transfer gate 38 selectively connects the inverter output 34 with a second latch node 40 when CLK is low, and decouples the output of the second inverter 36 from the node 40 when CLK is high. Moreover, the third transfer gate 42 selectively couples the first and second latch nodes 24, 40 to one another when RET is low and decouples the nodes 24, 40 when RET is high. During active mode operation with RET low, the slave latch 20 operates to clock data in from the master latch 10 according to the CLK signal and temporarily stores a data bit as a voltage at the first latch node 24, which is inverted by the inverter 26 to form the flip-flop Q output state (e.g., voltage level) at the output node 28.

When activated, the balloon latch circuit 50 receives the data bit from the slave latch circuit 20 via a fourth transfer gate 51 formed of HVT transistors HMP5 and HMN2 when activated with the transfer signal TSFRZ in a low state to couple the first latch node 24 of the slave latch 20 with a fourth latch node 52 of the balloon latch 50, and a third inverter 53 receives the signal at the node 52 as an input. When the inverter 53 is powered via MP15 and MP16 via a low signal RETZ from the inverter 64 or a low signal TSFRZ, an inverted output is provided to an input 54 of a fourth inverter 55, which is powered from VDDC when RETZ is low via MP17 and RET is high via MN15 to provide an inverted output to the fourth latch node 52, thereby storing the data bit transferred from the slave latch 20.

In the D flip-flop circuit 2 of FIGS. 1 and 2, the master latch 10 initially clocks in the data from the D input via a fifth transfer gate 11 according to the CLKZ signal (e.g., when CLK is low) to couple the D input with a master latch node 12 connected to provide an input to a fifth inverter 13. In certain embodiments, the inverter 13 may be replaced by a logic gate, such as a NAND gate 13a as shown in FIG. 11 below. The output of the inverter 13 in FIGS. 1 and 2 is coupled to an input 14 of a sixth transfer gate 15 operative when RET is low during active mode operation to couple the output of the inverter 13 with the first latch input node 16 and with an input of a sixth inverter 17 whose output 18 is provided to a seventh transfer gate 19 operated according to the CLK signal to provide a signal from the output of the inverter 17 to the master latch input node 12. In this manner, the inverters 13 and 17 of the master latch 10 operate during active mode to latch the data received at the flip-flop input D according to the clock signal CLK.

As seen in FIG. 2, the master latch 10 and the slave latch 20 are formed of LVT and/or SVT transistors MP (PMOS), MN (NMOS) including PMOS transistors MP1, MP2, MP3, MP4 and MP5 and NMOS transistors MN1, MN2, MN3, MN4 and MN5 of the master latch circuit 10, as well as PMOS transistors MP6, MP7, MP8, MP9, MP10 and MP11 and NMOS transistors MN6, MN7, MN8, MN9, MN10 and MN11 of the slave latch circuit 20. Moreover, the PMOS transistors of the inverters 13, 17, 26, 30 and 34 include source terminals powered by connection to the switchable voltage node VDDs as shown in FIG. 2 for selective disconnection from power for low-power retention mode operation. In the illustrated embodiment, the source terminals of the LVT and/or SVT NMOS transistors in the inverters 13, 17, 26, 30 and 34 are connected to a circuit ground GND (as are the HVT transistors of the balloon latch circuit 50 in the illustrated embodiment), whereby the HVT power switch control circuit HMP4 provides high-side disconnection for low-power retention mode operation. In another possible embodiment, low-side disconnection may be provided, with suitable connection of the LVT and/or SVT transistors of the latch circuits 10, 20 with the ground terminal GND through one or more HVT power disconnect transistors (e.g., NMOS HVT transistor, not shown), for example according to a switching control signal (e.g., PONIN) from the power management control circuit 60. Other implementations are possible, in which both high-side and low-side power decoupling can be provided to implement low-power retention mode operation of the sequential circuit 2.

Figures 3, 4:
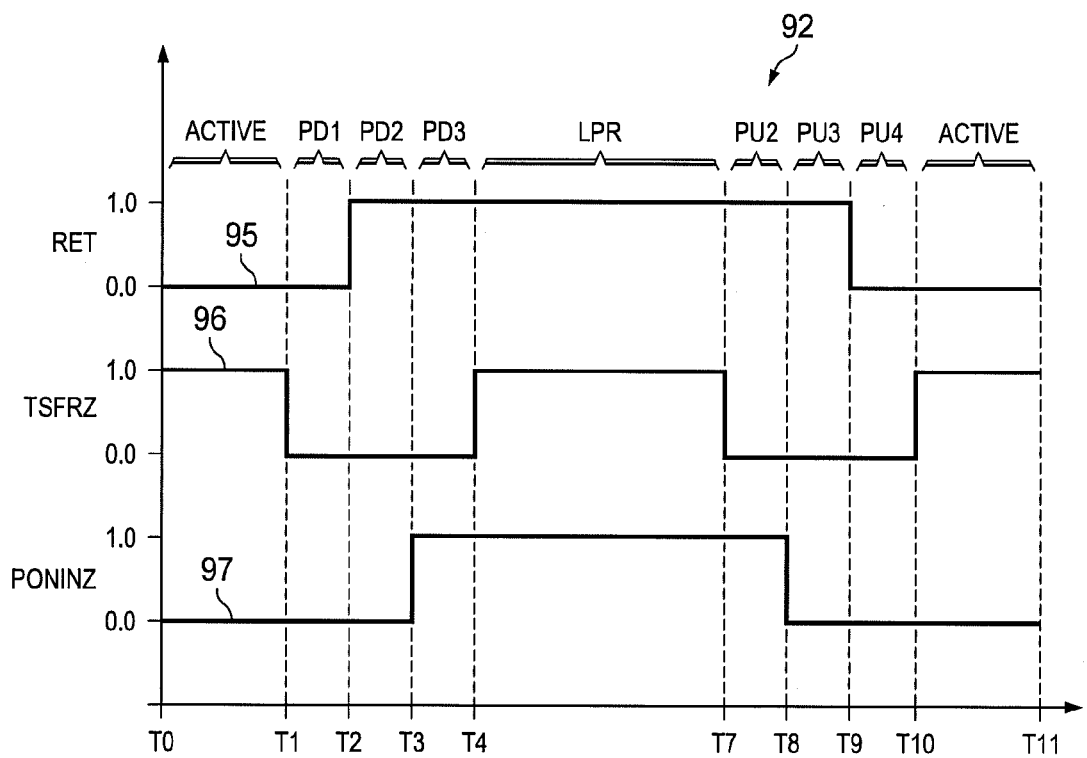
FIG. 3 is a table illustrating various signal states for transitions between active and low-power retention modes in the sequential circuit of FIGS. 1 and 2.
FIG. 4 is a graph illustrating various signal waveforms during transitions between active and low-power retention modes in the sequential circuit of FIGS. 1 and 2.

Referring also to FIGS. 3 and 4, FIG. 3 illustrates a table 90 showing signal states for active mode operation ("ACTIVE") and low-power retention mode operation ("LPR"), along with a power down sequence PD1, PD2 and PD3 to transition the sequential circuit 2 from the active mode to the low-power retention mode, and a power up sequence PU2, PU3 and PU4 for transitioning from the low-power retention mode to the active mode. In addition, FIG. 4 shows a graph 92 including waveforms 95, 96 and 97 respectively showing the RET, TSFRZ and PONINZ signal waveforms in the sequential circuit 2 of FIGS. 1 and 2.

Beginning in active mode operation at T1 in FIG. 4, the controller 60 provides low signals (e.g., "0" in table 90 of FIG. 3) for RET and PONINZ and high signal TSFRZ. In this condition, the sequential circuit 2 can operate according to the clock signal CLK for high-speed operation with no HVT transistors affecting the circuit operation. In this manner, none of the logic circuitry with a floating input is powered, and the floating latch node 52 in the balloon latch circuit 50 is not connected to any powered input.

The controller 60 begins a power down sequence at T1 with a first power down phase PD1 in which the TSFRZ signal is provided in a low state ("0" in FIG. 3) while the RET and PONINZ signals remain low. As seen in FIG. 1, this activates the transfer gate 51 of the balloon latch circuit 50 to connect the first latch node 24 with the fourth latch node 52 to provide a data transfer path from the slave latch 20 to the balloon latch 50. In addition, this causes the transistor MP16 to turn ON, thereby connecting the balloon latch inverter 53 to the continuous voltage node VDDC, to power up the inverter 53.

In a subsequent second power down phase PD2 beginning at T2, the control circuit 60 provides the retention signal RET in a high state while maintaining the PONINZ signal and the TSFRZ signal low. This assertion of the RET signal in phase PD2 turns off the transfer gate 15 in the master latch 10 as well as the transfer gate 42 in the slave latch 20, while providing power and ground connections for the balloon latch inverter 55 via transistors MP17 and MN15.

Thereafter at T3, the controller 60 implements a third power down phase PD3 in which the control circuit 60 provides high signals RET and PONINZ, and low signal TSFRZ. This assertion of PONINZ acts to disconnect VDDs from VDDC via transistor HMP4 with the transferred data from the slave latch 20 now stored in the balloon latch circuit 50.

The power down sequence is completed at T4 with the control circuit 60 bringing TSFRZ high again to decouple the first latch node 24 of the slave latch 20 from the balloon latch node 52. Moreover, the continued assertion of the RET signal maintains the provision of power to the balloon latch inverter 53 via the transistor MP15.

With the balloon latch transfer gate 51 off, and with the master and slave latch circuitry and the clock source 80 powered down, the low-power retention (LPR) mode from T4 through T7 provides for clock-independent saving of the latch data in the balloon latch circuit 50 with no SVT or LVT leakage path since the SVT and LVT transistors of the latch circuits 10 and 20 are powered down and the balloon latch transfer gate 51 is off. Moreover, unlike certain conventional MTCMOS sequential circuits, the illustrated circuitry 2 does not require a separate latch for clock state retention, and allows for the chip level clock tree to be powered down via the PONINZ signal from the control circuit 60 and the transistor HMP4 to turn off the clock source 80, thereby facilitating further power savings. Moreover, the illustrated circuitry does not need to retain the clock state inside the flip-flop circuit 2 as subsequent restoration operation ensures that the slave latch 20 is always successfully restored (written), and if CLK is high ("1"), the master latch circuit 10 also is written during restoration. Thus, the illustrated design provides significant advantages over conventional MTCMOS sequential circuits.

Continuing at T6 in FIGS. 3 and 4, the control circuit implements a power up sequence PU2, PU3 and PU4 to transition from the low-power retention mode operation to the active mode operation of the sequential circuit 2. The power up sequence begins at PU2 with the control circuit 60 again asserting the TSFRZ signal to a low state at T7 to turn on the transfer gate 51 of the balloon latch circuit 50, thereby coupling the slave latch node 24 with the balloon latch node 52.

At T8, the control circuit 60 implements a third power up phase PU3 by changing the PONINZ signal to the low state to power up the inverters 13, 17, 26, 30 and 34 of the master latch circuit 10 and the slave latch circuit 20 via transistor HMP4, and the fourth power up phase PU4 begins at T9 with the control circuit 60 bringing the RET signal low. This powers down the balloon latch inverter 55 and turns on the LVT or SVT transfer gates 15 and 42 in the master and slave latches 10 and 20, respectively.

Thereafter it T10, the control circuit 60 returns to active mode operation by bringing the transfer signal TSFRZ high to again turn off the balloon latch transfer gate 51 and to power down the HVT inverters 53 and 55. Regardless of the clock state during this restore operation, the buffered data is successfully transferred from the balloon latch 50 to the slave latch 20, and subsequent cycles of the clock signal CLK will resume transfer of input data into the master latch circuit 10 and data from the master latch to the slave latch 20 to ensure the proper state of the flip-flop output data Q at the output node 28. In this regard, the illustrated circuitry does not require a separate balloon or shadow latch for preserving clock state during low-power retention mode.

Figure 5:
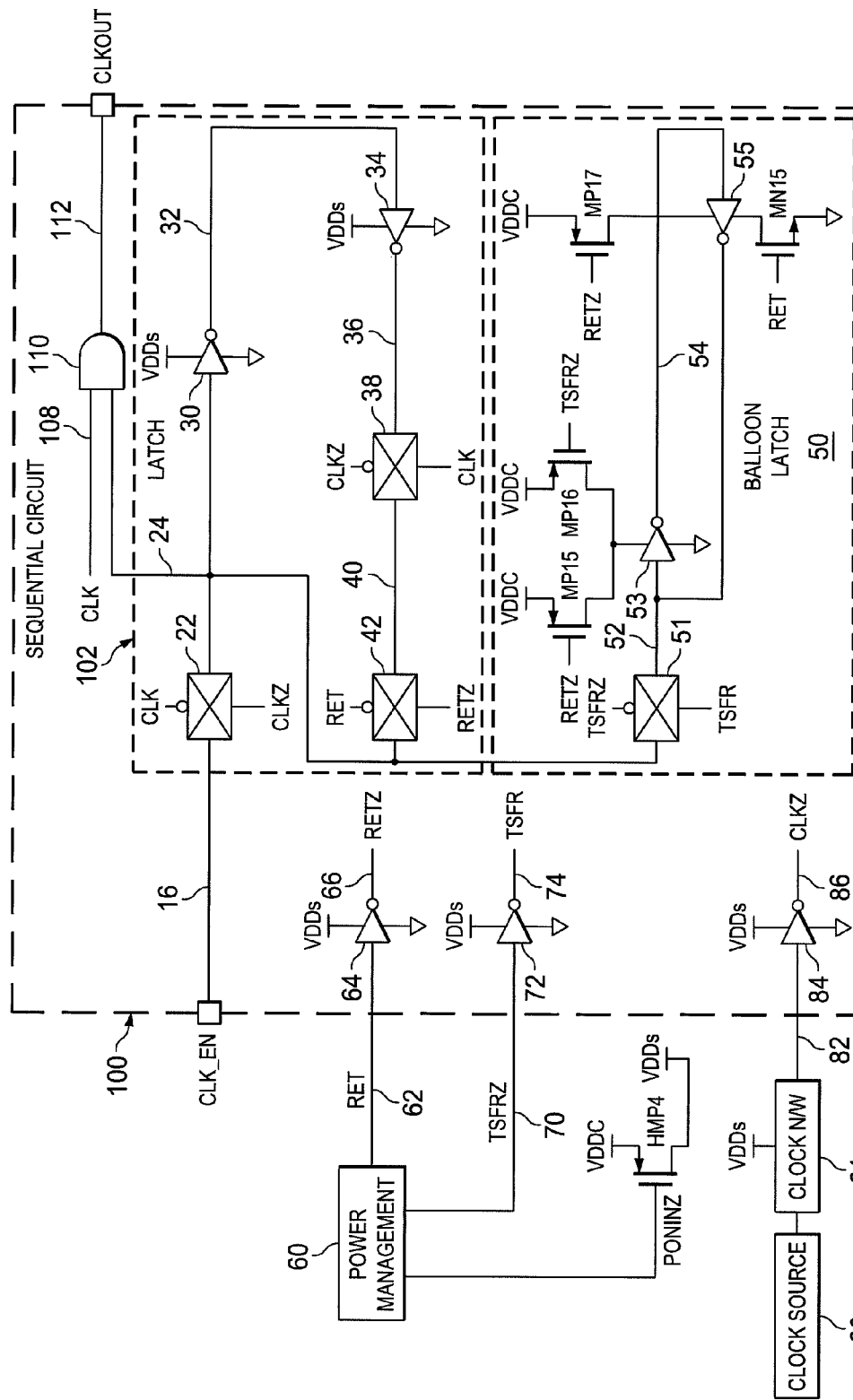
FIG. 5 is a simplified schematic diagram illustrating an integrated clock gating cell (ICG) sequential circuit embodiment with an MTCMOS shadow latch circuit.
Figure 6:
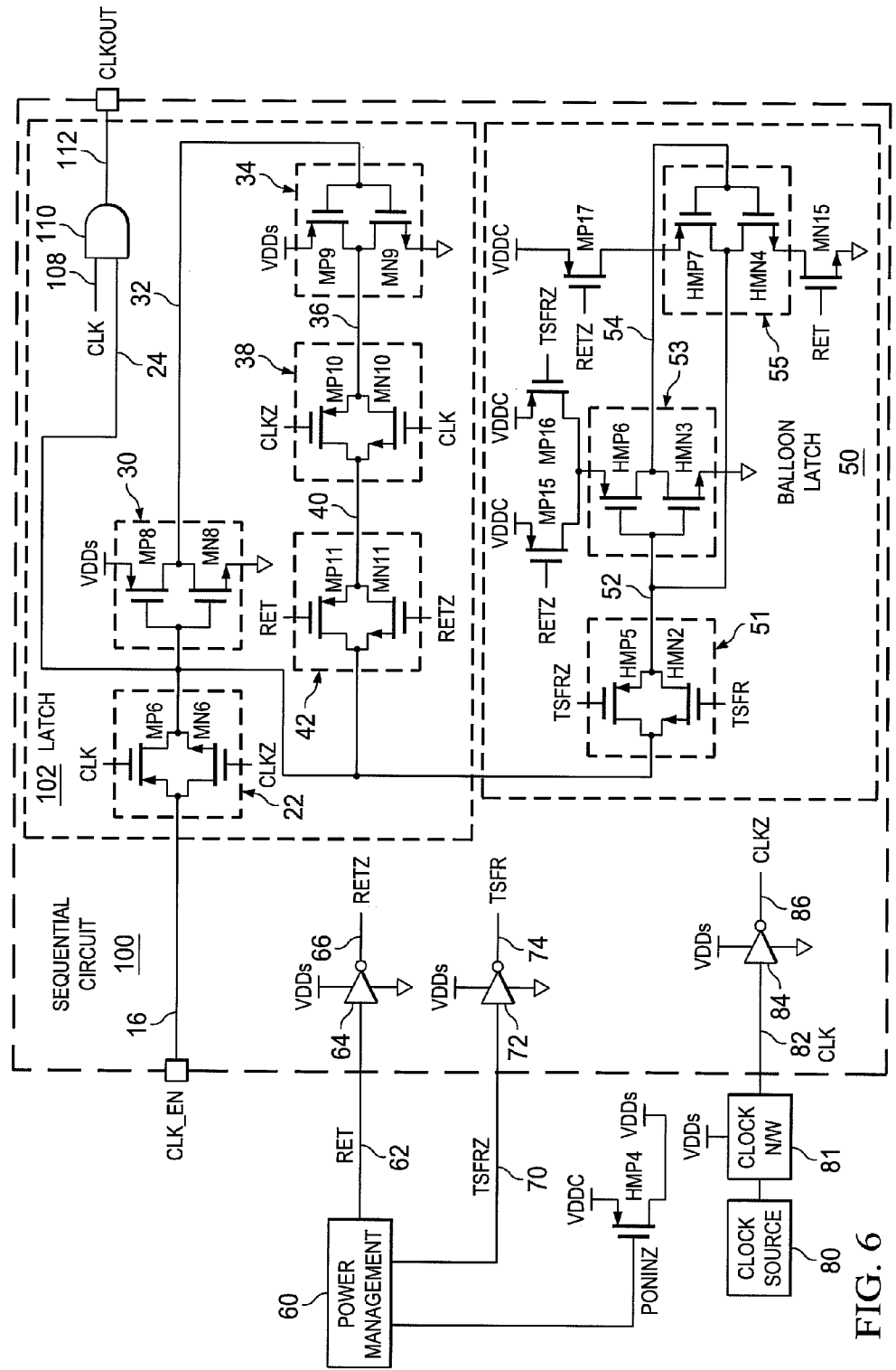
FIG. 6 is a detailed schematic diagram illustrating an implementation of the ICG sequential circuit embodiment of FIG. 5.

Referring now to FIGS. 5 and 6, another MTCMOS sequential circuit 100 is illustrated including a first latch 102 generally similar to the slave latch 20 of FIGS. 1 and 2 described above, without the output inverter 26, where the circuit 100 implements an integrated clock gating cell (ICG) with an input receiving a clock enable signal CLK_EN at the first latch input node 16. The latch 102 in this case includes transfer gates 22, 38 and 40 operated according to the clock and retention signals CLK and RET as described above, as well as inverters 30 and 34 powered from the switchable voltage node VDDs and formed using SVT and/or LVT transistors with threshold voltages in the first range. In the first latch 102 of FIGS. 5 and 6, moreover, the transfer gates 22 and 38 are operated in inverse fashion relative to the slave latch 20 of FIGS. 1 and 2, with the transfer gate 22 in FIGS. 5 and 6 being turned on (conductive) to connect the nodes 16 and 24 when the CLK signal is low (CLKZ is high), and the transfer gate 38 being on (conductive) when CLK is high (CLKZ is low). In addition, the clock gating cell sequential circuit 100 includes an AND gate 110 with a first input 108 receiving the CLK signal from the clock source 80 (FIGS. 1 and 2 above) and a second input coupled with the first latch node 24. The AND gate 110 in this embodiment is implemented using transistors with threshold voltages in the first range, and includes a gate output 112 providing a clock output signal CLKOUT.

In operation, the control circuit 60 provides the control signals RET, TSFRZ and PONINZ as illustrated and described above in connection with FIGS. 3 and 4 to operate the clock gating cell circuit 100 of FIGS. 5 and 6. While the above embodiments illustrate implementation of the first latch 20, 100 and the balloon latch circuit 50 in the context of a flip-flop sequential circuit 2 (FIGS. 1 and 2) and a clock gating cell circuit 100 (FIGS. 5 and 6), other embodiments are possible implementing other forms of sequential circuits using the concepts of the present disclosure.

Figure 8:
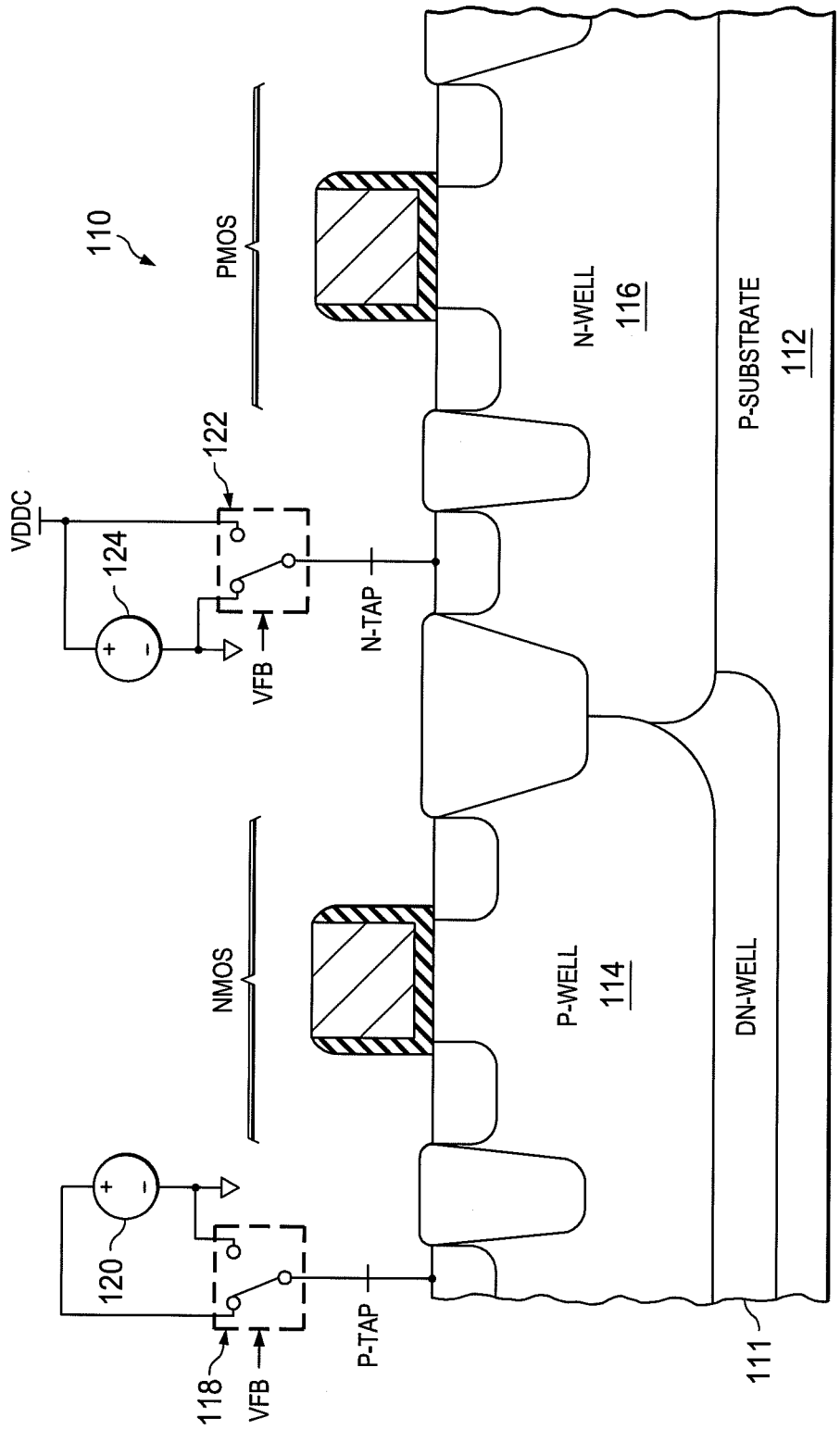
FIG. 8 is a partial sectional side elevation view of a portion of an MTCMOS integrated circuit illustrating P-well and N-well taps for controlled adjustment of forward biasing in the MTCMOS sequential circuit of FIG. 7.

Referring now to FIGS. 7-10, FIG. 7 illustrates another D flip-flop sequential circuit 2 including a master latch circuit 10, a slave latch circuit 20, a balloon latch circuit 50 and various control circuitry as described above. In addition, the power management control circuit 60 in this embodiment selectively provides a forward bias control signal VFB for enhanced high-speed active mode operation. FIG. 8 is a sectional side elevation view showing a portion of an MTCMOS integrated circuit (IC) 110 implementing the sequential circuit 2 of FIG. 7, and illustrating P-well and N-well taps for selectively adjusting a bias voltage applied to wells for improving operation of one, some or all of the NMOS and/or PMOS transistors in the sequential circuit 2. As seen in FIG. 8, the integrated circuit 110 is constructed using a P-substrate 112 in which an NMOS transistor is formed in and/or on a P-well 114 within a deep N-well (DN-well) 111, and a PMOS transistor is formed in and/or on an N-well 116. A forward bias circuit 118, 120 is provided in the integrated circuit 110 to selectively apply a non-zero forward biased to the P-well 114 via a P-tap according to the VFB signal from the control circuit 60, where asserting the signal VFB in a first state (e.g., high) connects the P-tap to a positive terminal of a bias voltage source 120 as shown, thereby raising the bias to the NMOS transistor(s) relative to ground for faster switching. In the illustrated embodiment, moreover, asserting the VFB signal connects the N-tap to a negative terminal of a bias voltage source 124 to selectively reduce the voltage at the N-well 116 from VDDC to a lower voltage to improve switching operation of the PMOS transistor(s). In this embodiment, the forward biasing circuitry 118, 120, 122 and 124 can be used to modify LVT, SVT and/or HVT NMOS and PMOS transistors in the latch circuits 10, 20 and/or 50, with the control circuit 60 selectively disabling the biasing by bringing VFB low during the low-power retention mode operation to further reduce power consumption. In this regard, turning off the forward biasing during the low-power retention mode conserved power by reducing leakage that would otherwise result from application of the forward bias, and also the power required to generate the body-biases (e.g., the power from the voltage sources 120 and 124 in FIG. 8). Moreover, separate biasing control can be provided for different wells for individualized biasing in certain embodiments. By this technique, the P-well 114 is connected through the switch 118 and the P-tap to the ground terminal GND, while the N-well 116 is connected to VDDC through the N-tap and the switch 122 during the low-power retention mode. It is noted in this regard that while the illustrated example provides the VFB signal from the power management controller 60, such a forward bias control signal can be provided by other control circuitry within the integrated circuit, for example, separate from the power management controller 60.

Figures 9, 10:
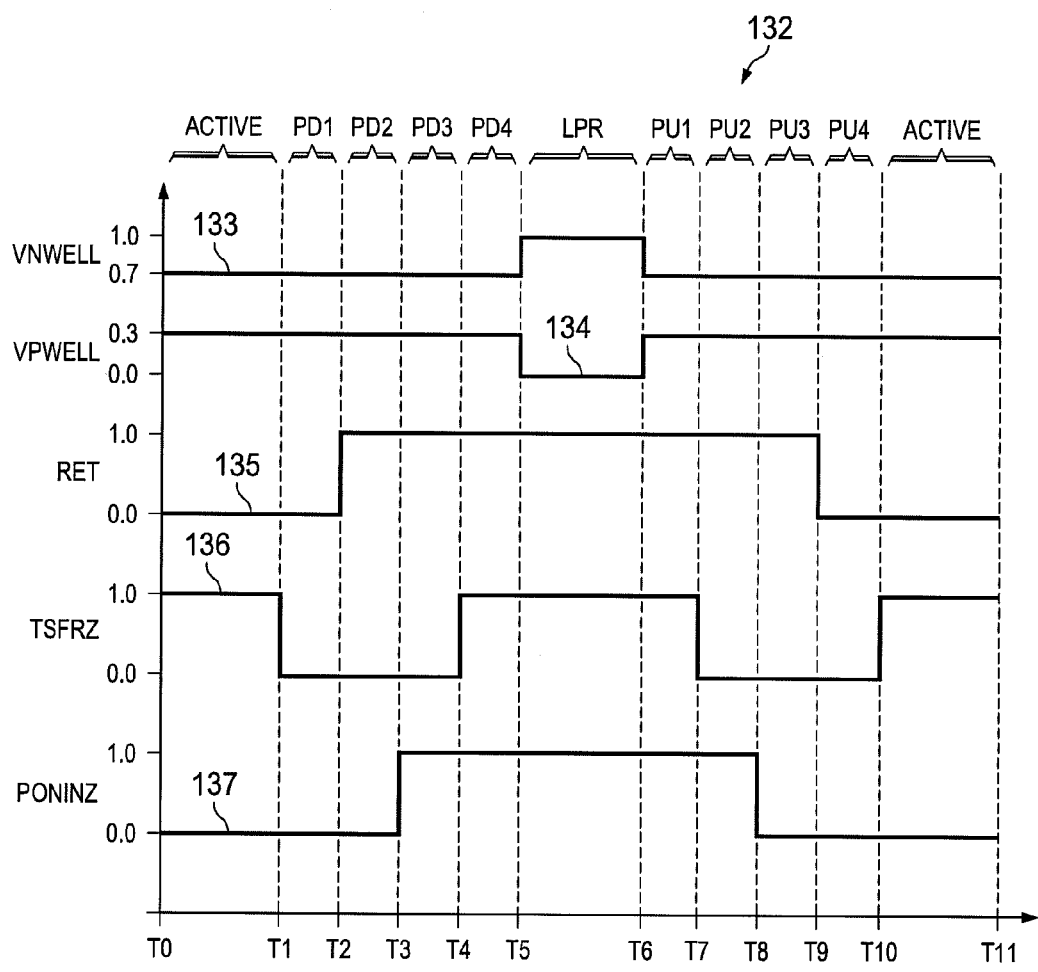
FIG. 9 is a table illustrating various signal states for transitions between active and low power retention modes in the sequential circuit of FIG. 7.
FIG. 10 is a graph illustrating various signal waveforms during transitions between active and low power retention modes in the sequential circuit of FIG. 7.

Operation of this embodiment is further illustrated in the table 130 of FIG. 9 and the graph 132 of FIG. 10. In general, the control circuit 60 operates in similar fashion to that described above in connection with FIGS. 3 and 4 to provide the control signals RET, TSFRZ and PONINZ (waveforms 135, 136 and 137 in the graph 132 of FIG. 10) for active mode operation ("ACTIVE"), low-power retention mode ("LPR"), as well as for a power down sequence PD1, PD2, PD3 and PD4 and a power up sequence PU1, PU2, PU3 and PU4. Beginning in active mode operation at T1 in FIG. 10, the controller 60 provides low signals (e.g., "0" in table 90 of FIG. 3) for RET and PONINZ while TSFRZ and a forward bias control signal VFB are held high, with the sequential circuit 2 operating according to the clock signal CLK for high-speed operation with no HVT transistors affecting the circuit operation. The controller 60 begins the power down sequence at T1 with a first power down phase PD1 in which the TSFRZ, RET and PONINZ signals are provided in a low state while VFB remains high. This activates the transfer gate 51 of the balloon latch circuit 50 to connect the first latch node 24 with the fourth latch node 52 to provide a data transfer path from the slave latch 20 to the balloon latch 50 and TSFRZ going low connects the balloon latch inverter 53 to the continuous voltage node VDDC via transistor MP16 to power up the inverter 53. In the second power down phase PD2 beginning at T2, the control circuit 60 provides the retention signal RET and the VFB signal in a high state while the PONINZ and TSFRZ signals are low, which turns off the transfer gate 15 in the master latch 10 as well as the transfer gate 42 in the slave latch 20, while providing power and ground connections for the balloon latch inverter 55 via transistors MP17 and MN15.

At T3, the controller 60 implements phase PD3 by providing high signals VFB, RET, and PONINZ while maintaining TSFRZ low to disconnect VDDs from VDDC via transistor HMP4 with the transferred data from the slave latch 20 now stored in the balloon latch circuit 50. The power down sequence is completed at T4 in this example with a fourth power down phase PD4 in which the control circuit 60 brings TSFRZ high again to decouple the first latch node 24 of the slave latch 20 from the balloon latch node 52. Moreover, the continued assertion of the RET signal in PD4 maintains the provision of power to the balloon latch inverter 53 via the transistor MP15.

At T5, the control circuit 60 sets the VFB signal low to remove any forward biasing. With transfer gate 51 off and with the master and slave latch circuitry and the clock network 81 powered down, the low-power retention (LPR) mode from T5 through T6 provides for clock-independent saving of the latch data in the balloon latch circuit 50 with no SVT or LVT leakage path since the SVT and LVT transistors of the latch circuits 10 and 20 are powered down along with the inverters 64, 72 and 84, and the balloon latch transfer gate 51 is off. Moreover, unlike certain conventional MTCMOS sequential circuits, no separate latch is required for clock state retention, and thus the chip level clock tree can be powered down via the PONINZ signal from the control circuit 60 thereby facilitating further power savings. Furthermore, the illustrated circuitry does not need to retain the clock state inside the flip-flop circuit 2 as subsequent restoration operation ensures that the slave latch 20 is always successfully restored (written), and if CLK is high ("1"), the master latch circuit 10 also is written during restoration.

At T6, the control circuit 60 implements a power up sequence PU1, PU2, PU3 and PU4 to transition from the low-power retention mode operation to the active mode operation of the sequential circuit 2. Beginning with reassertion of the VFB signal high in phase PU1 at T6, the control circuit 60 again takes the TSFRZ signal low at T7 in the subsequent second power up phase PU2 to turn on the transfer gate 51 of the balloon latch circuit 50, thereby coupling the slave latch node 24 with the balloon latch node 52. At T8, the control circuit 60 implements a third power up phase PU3 by changing the PONINZ signal to the low state to power up the inverters 13, 17, 26, 30 and 34 of the master latch circuit 10 and the slave latch circuit 20 via transistor HMP4, and the fourth power up phase PU4 begins at T9 with the control circuit 60 bringing the RET signal low to power down the balloon latch inverter 55 and turn on the LVT or SVT transfer gates 15 and 42 in the master and slave latches 10 and 20, respectively. At T10, the control circuit 60 returns to active mode operation by bringing the transfer signal TSFRZ high to again turn off the balloon latch transfer gate 51 and to power down the HVT inverters 53 and 55. As with the above embodiments, the buffered data is successfully transferred from the balloon latch 50 to the slave latch 20 independent of the clock state during the restore operation, and subsequent cycles of the clock signal CLK will resume transfer of input data into the master latch circuit 10 and data from the master latch to the slave latch 20 to ensure the proper state of the flip-flop output data Q at the output node 28.

As seen above, the control circuit 60 provides the VFB signal to the switches 118 and 122 in a high or active state (e.g., "1" in the table 130 of FIG. 9) during the during the active mode operation and the power down and power up sequences in order to facilitate high-speed operation by application of the forward biasing via the sources 120 and 124 to forward bias the NMOS and PMOS transistors of the sequential circuit 2. During these time periods, using a 1.0 V VDDC example, and assuming a 0.3 V biasing for both the P-well via source 120 and the N-well via source 124, the N-well voltage VNWELL curve 133 is at approximately 0.7 V to forward bias the PMOS transistors for fast switching, and the P-well voltage VPWELL curve 134 in FIG. 10 is at approximately 0.3 V to forward bias the NMOS transistors for fast switching. The N-well and P-well bias levels provided by the voltage sources 124 and 120 need not be the same, and any suitable values can be used in various embodiments. Moreover, in certain embodiments, different biasing is applied with respect to LVT, SVT and/or HVT transistors in the sequential circuit 2. During the low-power retention mode from T5 through T6 in FIG. 10, however, the control circuit 60 removes the forward biasing by changing the VFB signal to a low ("0") state, thereby connecting the P-well 114 to ground and connecting the N-well 116 to VDDC for further power conservation.

FIG. 11 illustrates another possible sequential circuit embodiment 2, again implementing a D flip-flop similar to the embodiment described above in connection with FIGS. 1 and 2, additionally providing a reset or clear function via a CLRZ input. In this example, the master latch circuit 10 includes a NAND gate 13a in place of the inverter 13 used in the embodiment of FIGS. 1 and 2, and the slave latch circuit 20 includes a NAND gate 34a implemented in place of the inverter 34 shown in FIGS. 1 and 2. In the illustrated example, moreover, the NAND gates 13a and 34a are formed using LVT and/or SVT transistors having threshold voltages in the first range. As seen in FIG. 11, the NAND gate 13a receives a first input from the master latch node 12 and receives the CLRZ signal as a second input, while providing an output to the transfer gate 15 at node 14. In addition, the NAND gate 34a of the slave latch circuit 20 receives a first input from the output of the inverter 30 at node 32 and receives the CLRZ signal as a second input, while providing an output at node 36 to the transfer gate 38.

Figure 12:
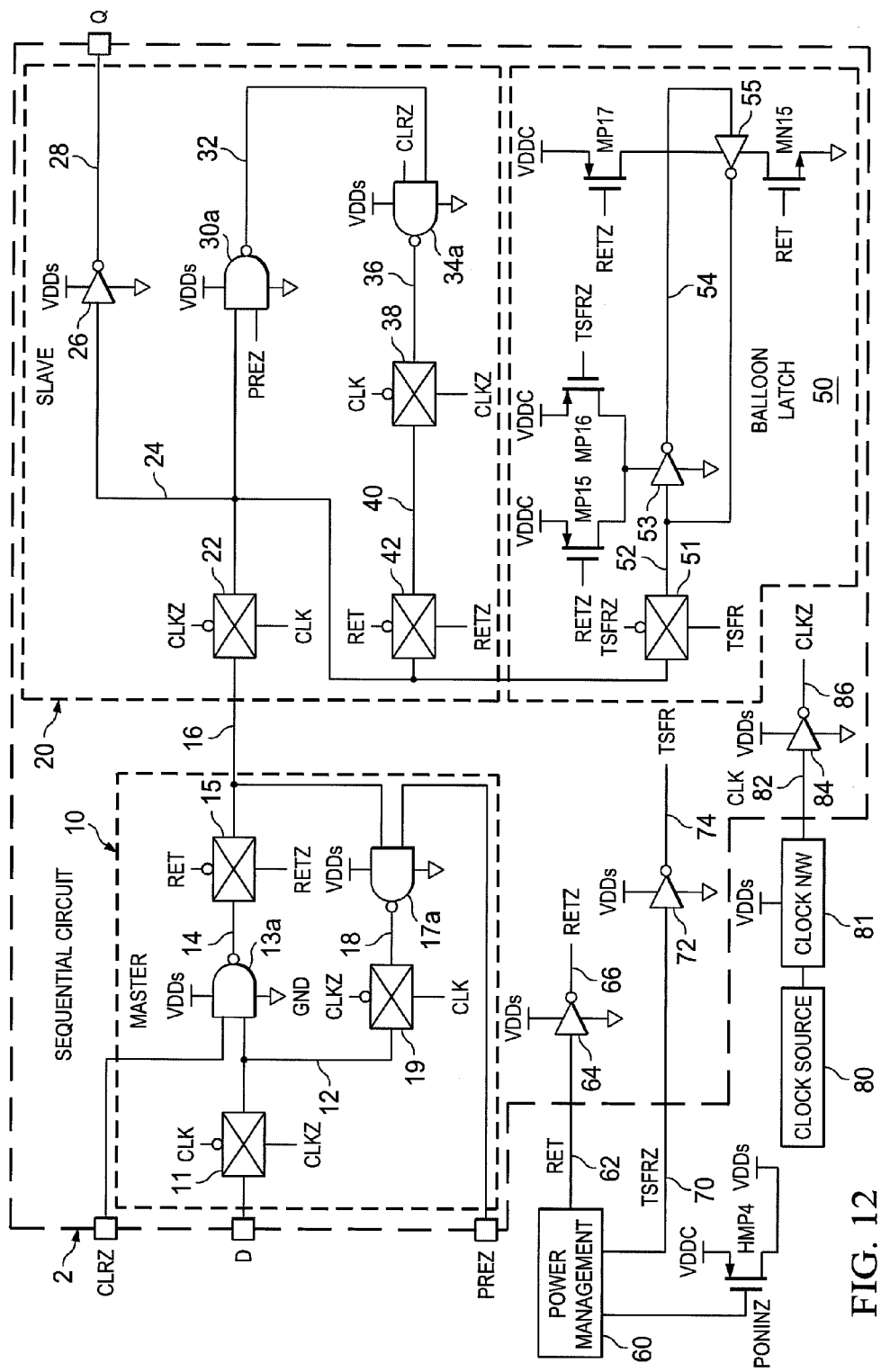
FIG. 12 is a schematic diagram illustrating another flip-flop MTCMOS sequential circuit embodiment in which the master and slave latch circuits include NAND gates for implementing preset and clear or reset functions.

FIG. 12 illustrates another non-limiting flip-flop MTCMOS sequential circuit embodiment with master and slave latch circuits 10 and 20 and a balloon latch circuit 50 similar to the circuit 100 of FIG. 11, where the inverters 17 and 30 are replaced with NAND gates 17a and 30a in the master and slave latches 10 and 20, respectively. The NAND gates 17a and 30a have first inputs connected to the nodes 16 and 24, respectively, as well as second inputs connected to an inverted preset control signal PREZ as shown. This further option allows presetting of the flip-flop state, with the NAND gates 17a and 30a being powered from VDDs and formed of SVT and/or LVT transistors having threshold voltages in the first range to facilitate high-speed operation. And connect them to another input (say PREZ), we get a presetable version. This embodiment provides clear or reset as well as preset functionality while providing the above-described advantages with respect to power savings in low-power retention mode along with high-speed operation during normal mode.

Many other alternate forms of sequential circuits may be provided in different embodiments, wherein the illustrated examples present only a few non-limiting implementations to illustrate the various concepts of the present disclosure. In this regard, the provision of a HVT transfer gate 51 in the second latch circuit 50 provide significant advantages over conventional MTCMOS sequential circuits, and the novel architectures provide for timely resumption of normal operation without the need for separate balloon latch storage of a clock state. The presently disclosed concepts thus provide multi-threshold voltage CMOS sequential circuitry in which all the transistors involved in active mode operation are SVT and/or LVT transistors, and the data state is retained during low-power retention mode in the shadow or balloon latch circuit 50 having a transfer gate 51 formed using HVT transistors. In addition, the balloon latch 50 is completely disconnected from the master and slave latches 10, 20 by HVT transmission during both active mode and low-power retention mode to save leakage power via the balloon latch transfer gate 51 which is turned on only during mode transitions. The disclosed embodiments, moreover, ensure that performance parameters such as setup-time, hold-time, clock-to-output delay and minimum clock-pulse width are not affected by the HVT transistors, while the leakage in the low-power retention mode is not affected by SVT or LVT transistors. Accordingly, the resulting sequential circuitry can advantageously facilitate high performance in active mode and low-leakage in the low-power retention mode.

The above examples are merely illustrative of several possible embodiments of various aspects of the present disclosure, wherein equivalent alterations and/or modifications will occur to others skilled in the art upon reading and understanding this specification and the annexed drawings. In addition, although a particular feature of the disclosure may have been disclosed with respect to only one of multiple implementations, such feature may be combined with one or more other features of other embodiments as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

What is claimed is:

1. A multi-threshold CMOS sequential circuit, comprising:
   a first latch circuit formed of transistors having threshold voltages in a first range and powered from a switchable voltage node to provide a primary data path storing at least one data bit during active mode operation of the sequential circuit; and
   a second latch circuit, comprising:
      inverters formed of transistors selectively powered from a continuous voltage node and having threshold voltages in a second range higher than the first range, the inverters of the second latch circuit selectively operative for low-power retention mode operation of the sequential circuit to latch the at least one data bit transferred from the first latch circuit,
      a transfer gate formed of transistors having threshold voltages in the second range and providing a data transfer path between the first and second latch circuits during transitions from active to low-power retention mode and vice versa, the transmission gate operative to disconnect the first and second latch circuits from one another during both active mode and low-power retention mode operation of the sequential circuit, and
      a second switching circuit selectively operative to disconnect the inverters of the second latch circuit from the continuous voltage node during active mode operation of the sequential circuit.

2. The sequential circuit of claim 1:
   wherein the first latch circuit comprises:
      a first transfer gate selectively operative to couple a first latch input node with a first latch node when a clock signal is in a first state, and to decouple the first latch input node from the first latch node when the clock signal is in a second state,
      a first inverter or a first logic gate powered from the switchable voltage node and including a first inverter or logic gate input coupled with the first latch node,
      a second inverter or a second logic gate powered from the switchable voltage node and including a second inverter or logic gate input coupled with an output of the first inverter or logic gate,
      a second transfer gate selectively operative to decouple an output of the second inverter or the second logic gate from a second latch node when the clock signal is in the first state, and to couple the output of the second inverter or logic gate with the second latch node when the clock signal is in the second state, and
      a third transfer gate selectively operative to decouple the second latch node from the first latch node when a retention signal is in a first state, and to decouple the second latch node from the first latch node when the retention signal is in a second state;
   further comprising:
      a first switching circuit selectively operative to decouple the switchable voltage node from a continuous voltage node or to decouple the first latch circuit from a ground node when a switching control signal is in a first state for low-power retention mode operation of the sequential circuit, and to couple the switchable voltage node to the continuous voltage node or to couple the first latch circuit to the ground node when the switching control signal is in a second state for active mode operation of the sequential circuit, and
      a control circuit selectively operative in a first mode to provide the retention signal in the first state and the switching control signal in the first state for low-power retention mode operation of the sequential circuit, the control circuit selectively operative in a second mode to provide the retention signal in the second state and the switching control signal in the second state for active mode operation of the sequential circuit;
   wherein the second latch circuit comprises:
      a fourth transfer gate selectively operative to couple the first latch node with a fourth latch node when a transfer signal is in a second state, and to decouple the first latch node from the fourth latch node when the transfer signal is in a first state,
      a third inverter including a third inverter input coupled with the fourth latch node,
      a fourth inverter including a fourth inverter input coupled with an output of the third inverter, and a fourth inverter output coupled with the fourth latch node; and
   wherein the second switching circuit is selectively operative to couple a power terminal of the third inverter with the continuous voltage node when the retention signal is in the first state and the transfer signal is in the second state, and to decouple the power terminal of the third inverter from the continuous voltage node when the retention signal is in the second state or the transfer signal is in the first state, the second switching circuit being selectively operative to couple a first power terminal of the fourth inverter with the continuous voltage node and to couple a second power terminal of the fourth inverter with a ground terminal when the retention signal is in the first state, and to decouple the fourth inverter from the continuous voltage node and from the ground node when the retention signal is in the second state.

3. The sequential circuit of claim 2, wherein the second power switching circuit comprises:
   a first PMOS transistor including a source terminal coupled with the continuous voltage node, a drain terminal coupled with the power terminal of the third inverter, and a gate terminal coupled with the control circuit;
   a second PMOS transistor including a source terminal coupled with the continuous voltage node, a drain terminal coupled with the power terminal of the third inverter, and a gate terminal coupled with the control circuit;
   a third PMOS transistor including a source terminal coupled with the continuous voltage node, a drain terminal coupled with the first power terminal of the fourth inverter, and a gate terminal coupled with the control circuit; and a first NMOS transistor including a drain terminal coupled with the second power terminal of the fourth inverter, a source terminal coupled with the ground node, and a gate terminal coupled with the control circuit.

4. The sequential circuit of claim 2, wherein the sequential circuit is a flip-flop, comprising:
a master latch circuit formed of transistors having threshold voltages in the first range, the master latch circuit comprising:
a fifth transfer gate selectively operative to couple a master latch input node with a flip-flop input node when the clock signal is in the second state, and to decouple the master latch input node from the flip-flop input node when the clock signal is in the first state,
a fifth inverter or a third logic gate powered from the switchable voltage node and including a fifth inverter or third logic gate input coupled with the master latch node,
a sixth transfer gate selectively operative to decouple an output of the fifth inverter or the third logic gate from the first latch input node when the retention signal is in the first state, and to couple the output of the fifth inverter or the third logic gate with the first latch input node when the retention signal is in the second state,
a sixth inverter or a fourth logic gate powered from the switchable voltage node and including a sixth inverter or fourth logic gate input coupled with the first latch input node, and
a seventh transfer gate selectively operative to couple an output of the sixth inverter or the fourth logic gate with the master latch input node when the clock signal is in the first state, and to decouple the output of the sixth inverter or the fourth logic gate from the master latch input node when the clock signal is in the second state;
wherein the first latch circuit is a slave latch comprising a seventh inverter powered from the switchable voltage node, the fifth inverter including a seventh inverter input coupled with the first latch node, and an output providing a flip-flop data output.

5. The sequential circuit of claim 4, wherein the second power switching circuit comprises:
a PMOS transistor including a source terminal coupled with the continuous voltage node, a drain terminal coupled with the power terminal of the third inverter, and a gate terminal coupled with the control circuit;
a second PMOS transistor including a source terminal coupled with the continuous voltage node, a drain terminal coupled with the power terminal of the third inverter, and a gate terminal coupled with the control circuit;
a third PMOS transistor including a source terminal coupled with the continuous voltage node, a drain terminal coupled with the first power terminal of the fourth inverter, and a gate terminal coupled with the control circuit; and
a first NMOS transistor including a drain terminal coupled with the second power terminal of the fourth inverter, a source terminal coupled with the ground node, and a gate terminal coupled with the control circuit.

6. The sequential circuit of claim 4:
wherein the control circuit is operative to implement a power down sequence to transition from the active mode operation of the sequential circuit to the low-power retention mode operation of the sequential circuit, the power down sequence comprising:
a first power down phase, in which the control circuit provides the retention signal in the second state, the switching control signal in the second state, and the transfer signal in the second state,
a second power down phase after the first power down phase, in which the control circuit provides the retention signal in the first state, the switching control signal in the second state, and the transfer signal in the second state,
a third power down phase after the second power down phase, in which the control circuit provides the retention signal in the first state, the switching control signal in the first state, and the transfer signal in the second state, and
a fourth power down phase after the third power down phase, in which the control circuit provides the retention signal in the first state, the switching control signal in the first state, and the transfer signal in the first state; and
wherein the control circuit is operative to implement a power up sequence to transition from the low-power retention mode operation of the sequential circuit to the active mode operation of the sequential circuit, the power up sequence comprising:
a first power up phase, in which the control circuit provides the retention signal in the first state, the switching control signal in the first state, and the transfer signal in the first state,
a second power up phase after the first power up phase, in which the control circuit provides the retention signal in the first state, the switching control signal in the first state, and the transfer signal in the second state,
a third power up phase after the second power up phase, in which the control circuit provides the retention signal in the first state, the switching control signal in the second state, and the transfer signal in the second state, and
a fourth power up phase after the third power up phase, in which the control circuit provides the retention signal in the second state, the switching control signal in the second state, and the transfer signal in the second state.

7. The sequential circuit of claim 6, comprising a forward bias circuit selectively operative to apply a forward bias voltage to at least some transistors of the sequential circuit according to a forward bias control signal;
wherein the control circuit is selectively operative to provide the forward bias control signal in a first state to cause the forward bias circuit to apply the forward bias voltage in the second mode for active mode operation of the sequential circuit in the power down sequence and in the power up sequence; and
wherein the control circuit is selectively operative to provide the forward bias control signal in a second state to cause the forward bias circuit to refrain from applying the forward bias voltage in the first mode for low-power retention mode operation of the sequential circuit.

8. The sequential circuit of claim 4, comprising a forward bias circuit selectively operative to apply a forward bias voltage to at least some transistors of the sequential circuit according to a forward bias control signal;
wherein the control circuit is selectively operative to provide the forward bias control signal in a first state to cause the forward bias circuit to apply the forward bias voltage in the second mode for active mode operation of the sequential circuit; and wherein the control circuit is selectively operative to provide the forward bias control signal in a second state to cause the forward bias circuit to refrain from applying the forward bias voltage in the first mode for low-power retention mode operation of the sequential circuit.

9. The sequential circuit of claim 4, wherein the first switching circuit comprises a power switching transistor having a threshold voltage in the second range, the power switching transistor including a source terminal coupled with the continuous voltage node, a drain terminal coupled with the switchable voltage node, and a gate terminal receiving the switching control signal.

10. The sequential circuit of claim 2, wherein the first switching circuit comprises a power switching transistor having a threshold voltage in the second range, the power switching transistor including a source terminal coupled with the continuous voltage node, a drain terminal coupled with the switchable voltage node, and a gate terminal receiving the switching control signal.

11. The sequential circuit of claim 2, comprising a forward bias circuit selectively operative to apply a forward bias voltage to at least some transistors of the sequential circuit according to a forward bias control signal;
wherein the control circuit is selectively operative to provide the forward bias control signal in a first state to cause the forward bias circuit to apply the forward bias voltage in the second mode for active mode operation of the sequential circuit; and
wherein the control circuit is selectively operative to provide the forward bias control signal in a second state to cause the forward bias circuit to refrain from applying the forward bias voltage in the first mode for low-power retention mode operation of the sequential circuit.

12. The sequential circuit of claim 2:
wherein the control circuit is operative to implement a power down sequence to transition from the active mode operation of the sequential circuit to the low-power retention mode operation of the sequential circuit, the power down sequence comprising:
 a first power down phase, in which the control circuit provides the retention signal in the second state, the switching control signal in the second state, and the transfer signal in the second state,
 a second power down phase after the first power down phase, in which the control circuit provides the retention signal in the first state, the switching control signal in the second state, and the transfer signal in the second state,
 a third power down phase after the second power down phase, in which the control circuit provides the retention signal in the first state, the switching control signal in the first state, and the transfer signal in the second state, and
 a fourth power down phase after the third power down phase, in which the control circuit provides the retention signal in the first state, the switching control signal in the first state, and the transfer signal in the first state; and
wherein the control circuit is operative to implement a power up sequence to transition from the low-power retention mode operation of the sequential circuit to the active mode operation of the sequential circuit, the power up sequence comprising:
 a first power up phase, in which the control circuit provides the retention signal in the first state, the switching control signal in the first state, and the transfer signal in the first state,
 a second power up phase after the first power up phase, in which the control circuit provides the retention signal in the first state, the switching control signal in the first state, and the transfer signal in the second state,
 a third power up phase after the second power up phase, in which the control circuit provides the retention signal in the first state, the switching control signal in the second state, and the transfer signal in the second state, and
 a fourth power up phase after the third power up phase, in which the control circuit provides the retention signal in the second state, the switching control signal in the second state, and the transfer signal in the second state.

13. The sequential circuit of claim 2, wherein the sequential circuit is a clock gating cell, comprising:
a clock enable inverter powered from the switchable voltage node and including an input receiving a clock enable signal, and an output coupled with the first latch input node; and
an AND gate powered from the switchable voltage node, the AND gate formed of transistors having threshold voltages in the first range, and including a first input receiving the clock signal, a second input coupled with the first latch node, and an output providing a clock output signal.

14. The sequential circuit of claim 13, wherein the second power switching circuit comprises:
a first PMOS transistor including a source terminal coupled with the continuous voltage node, a drain terminal coupled with the power terminal of the third inverter, and a gate terminal coupled with the control circuit;
a second PMOS including a source terminal coupled with the continuous voltage node, a drain terminal coupled with the power terminal of the third inverter, and a gate terminal coupled with the control circuit;
a third PMOS transistor including a source terminal coupled with the continuous voltage node, a drain terminal coupled with the first power terminal of the fourth inverter, and a gate terminal coupled with the control circuit; and
a first NMOS transistor including a drain terminal coupled with the second power terminal of the fourth inverter, a source terminal coupled with the ground node, and a gate terminal coupled with the control circuit.

15. The sequential circuit of claim 13:
wherein the control circuit is operative to implement a power down sequence to transition from the active mode operation of the sequential circuit to the low-power retention mode operation of the sequential circuit, the power down sequence comprising:
 a first power down phase, in which the control circuit provides the retention signal in the second state, the switching control signal in the second state, and the transfer signal in the second state,
 a second power down phase after the first power down phase, in which the control circuit provides the retention signal in the first state, the switching control signal in the second state, and the transfer signal in the second state,
 a third power down phase after the second power down phase, in which the control circuit provides the retention signal in the first state, the switching control signal in the first state, and the transfer signal in the second state, and a fourth power down phase after the third power down phase, in which the control circuit provides the retention signal in the first state, the switching control signal in the first state, and the transfer signal in the first state; and wherein the control circuit is operative to implement a power up sequence to transition from the low-power retention mode operation of the sequential circuit to the active mode operation of the sequential circuit, the power up sequence comprising:

a first power up phase, in which the control circuit provides the retention signal in the first state, the switching control signal in the first state, and the transfer signal in the first state, a second power up phase after the first power up phase, in which the control circuit provides the retention signal in the first state, the switching control signal in the first state, and the transfer signal in the second state, a third power up phase after the second power up phase, in which the control circuit provides the retention signal in the first state, the switching control signal in the second state, and the transfer signal in the second state, and a fourth power up phase after the third power up phase, in which the control circuit provides the retention signal in the second state, the switching control signal in the second state, and the transfer signal in the second state.

16. The sequential circuit of claim 15, comprising a forward bias circuit selectively operative to apply a forward bias voltage to at least some transistors of the sequential circuit according to a forward bias control signal;

wherein the control circuit is selectively operative to provide the forward bias control signal in a first state to cause the forward bias circuit to apply the forward bias voltage in the second mode for active mode operation of the sequential circuit in the power down sequence and in the power up sequence; and wherein the control circuit is selectively operative to provide the forward bias control signal in a second state to cause the forward bias circuit to refrain from applying the forward bias voltage in the first mode for low-power retention mode operation of the sequential circuit.

17. The sequential circuit of claim 13, comprising a forward bias circuit selectively operative to apply a forward bias voltage to at least some transistors of the sequential circuit according to a forward bias control signal;

wherein the control circuit is selectively operative to provide the forward bias control signal in a first state to cause the forward bias circuit to apply the forward bias voltage in the second mode for active mode operation of the sequential circuit; and wherein the control circuit is selectively operative to provide the forward bias control signal in a second state to cause the forward bias circuit to refrain from applying the forward bias voltage in the first mode for low-power retention mode operation of the sequential circuit.

18. The sequential circuit of claim 13, wherein the first switching circuit comprises a power switching transistor having a threshold voltage in the second range, the power switching transistor including a source terminal coupled with the continuous voltage node, a drain terminal coupled with the switchable voltage node, and a gate terminal receiving the switching control signal.

19. An integrated circuit, comprising:
a first switching circuit including a power switching transistor selectively operative to decouple a switchable voltage node from a continuous voltage node or to decouple the first latch circuit from a ground node when a switching control signal is in a first state for low-power retention mode operation of the sequential circuit, and to couple the switchable voltage node to the continuous voltage node or to couple the first latch circuit with the ground node when the switching control signal is in a second state for active mode operation of the sequential circuit, the power switching transistor having a threshold voltage in the second range;

a sequential circuit, comprising:
a first latch circuit formed of transistors having threshold voltages in a first range and powered from a switchable voltage node to provide a primary data path storing at least one data bit during active mode operation of the sequential circuit, and a second latch circuit, comprising:
inverters formed of transistors selectively powered from the continuous voltage node and having threshold voltages in a second range higher than the first range, the inverters of the second latch circuit selectively operative in low-power retention mode operation of the sequential circuit to latch the at least one data bit transferred from the first latch circuit, a transfer gate formed of transistors having threshold voltages in the second range and providing a data transfer path between the first and second latch circuits during transitions from active to low-power retention mode and vice versa, the transmission gate operative to disconnect the first and second latch circuits from one another during both active mode and low-power retention mode operation of the sequential circuit, and a second switching circuit formed of transistors having threshold voltages in the first range, the second switching circuit selectively operative to disconnect the inverters of the second latch circuit from the continuous voltage node during active mode operation of the sequential circuit; and a control circuit selectively operative in a first mode to provide the switching control signal in the first state for low-power retention mode operation of the sequential circuit, the control circuit selectively operative in a second mode to provide the switching control signal in the second state for active mode operation of the sequential circuit.

20. The integrated circuit of claim 19:
wherein the control circuit is selectively operative in the first mode to provide a retention signal in a first state and in the second mode to provide the retention signal in a second state;

wherein the first latch circuit comprises:
a first transfer gate selectively operative to couple a first latch input node with a first latch node when a clock signal is in a first state, and to decouple the first latch input node from the first latch node when the clock signal is in a second state,
a first inverter or logic gate powered from the switchable voltage node and including a first inverter or logic gate input coupled with the first latch node, a second inverter or logic gate powered from the switchable voltage node and including a second inverter or logic gate input coupled with an output of the first inverter or logic gate, a second transfer gate selectively operative to decouple an output of the second inverter from a second latch node when the clock signal is in the first state, and to couple the output of the second inverter with the second latch node when the clock signal is in the second state, and a third transfer gate selectively operative to decouple the second latch node from the first latch node when the retention signal is in a first state, and to decouple the second latch node from the first latch node when the retention signal is in a second state;

wherein the second latch circuit comprises:

a fourth transfer gate selectively operative to couple the first latch node with a fourth latch node when a transfer signal is in a second state, and to decouple the first latch node from the fourth latch node when the transfer signal is in a first state, a third inverter or logic gate including a third inverter or logic gate input coupled with the fourth latch node, a fourth inverter or logic gate including a fourth inverter or logic gate input coupled with an output of the third inverter or logic gate, and a fourth inverter or logic gate output coupled with the fourth latch node; and wherein the second switching circuit is selectively operative to couple a power terminal of the third inverter with the continuous voltage node when the retention signal is in the first state and the transfer signal is in the second state, and to decouple the power terminal of the third inverter or logic gate from the continuous voltage node when the retention signal is in the second state or the transfer signal is in the first state, the second switching circuit being selectively operative to couple a first power terminal of the fourth inverter or logic gate with the continuous voltage node and to couple a second power terminal of the fourth inverter or logic gate with a ground terminal when the retention signal is in the first state, and to decouple the fourth inverter or logic gate from the continuous voltage node and from the ground node when the retention signal is in the second state.

\* \* \* \* \*